United States Patent [19]
Stevens et al.

[11] Patent Number: 6,162,006
[45] Date of Patent: Dec. 19, 2000

[54] STACKABLE CASSETTE FOR USE WITH WAFER CASSETTES

[75] Inventors: Ronald R. Stevens, Scottsdale; Ravinder Aggarwal, Dr. Gilbert, both of Ariz.

[73] Assignee: ASM America, Inc., Phoenix, Ariz.

[21] Appl. No.: 09/083,833

[22] Filed: May 22, 1998

[51] Int. Cl.⁷ .................................................. B65G 49/07
[52] U.S. Cl. ........................ 414/416; 414/937; 414/940
[58] Field of Search .................................... 414/937, 938, 414/939, 940, 416

[56] References Cited

U.S. PATENT DOCUMENTS

| | | | |
|---|---|---|---|
| 5,217,340 | 6/1993 | Harada et al. | 414/937 |
| 5,377,476 | 1/1995 | Bohmer et al. | 414/217 |
| 5,664,679 | 9/1997 | Schneider et al. | 414/940 |
| 5,685,684 | 11/1997 | Kato et al. | 414/937 |
| 5,772,386 | 6/1998 | Mages et al. | 414/937 |
| 5,940,175 | 8/1999 | Sun | 356/237.3 |

*Primary Examiner*—Thomas J. Brahan
*Attorney, Agent, or Firm*—Knobbe, Martens, Olson & Bear, LLP

[57] ABSTRACT

A stackable cassette for testing at least one separate wafer during the processing of a plurality of semiconductor wafers is disclosed. The stackable cassette includes a bottom surface which conforms to a top portion of a base cassette having a plurality of wafers. In addition, the stackable cassette includes two or more supports which extend vertically from the bottom surface and a top surface horizontally connected to the two supports. The supports include ribs which form channels for holding at least one wafer. When processing the plurality of wafers, the stackable cassette is placed on top of a base cassette. A specified processed wafer is placed within the stackable cassette. The stackable cassette is then removed for inspection of the test wafer.

17 Claims, 9 Drawing Sheets

STACKABLE CASSETTE FOR USE WITH WAFER CASSETTES

BACKGROUND OF THE INVENTION

1. Technical Field of the Invention

This invention relates to semiconductor wafer manufacturing, and more particularly, to a stackable cassette used in the processing of semiconductor wafers.

2. Description of Related Art

During the manufacture and processing of semiconductor wafers, cassettes are utilized to store and transport the wafers. These cassettes provide a protection for the wafers. A cassette holds several wafers, the standard cassette holds 13 or 25 wafers. The wafers are normally stacked horizontally, one above the other, which prevents each wafer from touching any other wafer. During the processing of these wafers, it is necessary for the manufacturer to occasionally monitor or test the results of different recipes used in the manufacturing of the wafers. Manufacturers refer to these wafers as test wafers and have used several methods to manufacture the test wafers. In one method, the manufacturer stops the processing of an entire cassette of wafers during a test cycle. However, this method is very time consuming, since it results in the stopping and starting of the wafer processing. This may result in a large economic penalty for a manufacturer.

In another method of testing wafers during their processing, manufacturers process a single wafer in the cassette. But this method suffers from the disadvantage of wasting the time necessary to process one wafer individually when several wafers could be processed during the same time period.

Manufacturers sometimes process an entire cassette of wafers and then test for the quality of the wafers. But manufacturers run the costly risk of processing an entire cassette of defective wafers. Additionally, in all of these methods, the manufacturer loses an efficient use of their processing operators, disrupting the flow of the wafer processing.

In the past, wafer cassettes have been known to be stackable for storage. However, these stackable cassettes do not allow the processed wafers to be directly placed within the stackable cassettes from the processing chamber.

Thus, it would be a distinct advantage to have an apparatus, system, and method providing the efficient testing of wafers during the processing of semiconductor wafers. It is an object of the present invention to provide such an apparatus, system, and method.

SUMMARY OF THE INVENTION

The present invention is a method of manufacturing a semiconductor test wafer. The method begins by extracting a wafer from a first cassette located below a second cassette. Next, the wafer is processed. The processed wafer is then placed within the second cassette. The second cassette is then removed from the top of the first cassette for testing or measurement of the processed wafer.

The present invention is also a system for manufacturing semiconductor wafers. The system includes a first cassette having a first bottom surface, a first plurality of supports having a plurality of ribs for holding a plurality of wafers extending vertically from the first bottom surface, and a first top surface horizontally connected to the first plurality of supports. In addition, the system also includes a second cassette having a second bottom surface adaptive for the placement of the second cassette to the top surface of the first cassette, a second plurality of supports having a plurality of ribs for holding at least one test wafer, extending vertically from the second bottom surface, a second top surface horizontally connected to the second plurality of supports. The second cassette is placed upon the first cassette having the plurality of semiconductor wafers. After processing a wafer from the plurality of wafers, the wafer, now called a test wafer, is placed in the second cassette. The test wafer can then be inspected when the second cassette is removed from the first cassette.

The second cassette comprises a base providing a bottom portion of the cassette. The base is in a shape conforming to a top portion of a first cassette having a plurality of wafers. The second cassette also includes a plurality of supports extending perpendicularly and vertically upward from the base, a top surface horizontally covering the plurality of supports, and means for holding at least one test wafer between the plurality of supports. The second cassette is stacked upon the top portion of the first cassette during or prior to the processing of the plurality of wafers. A wafer to be tested is placed within the second cassette. The cassette then is removed when testing the test wafer.

DETAILED DESCRIPTION OF EMBODIMENTS

The present invention is a stackable cassette for use in testing semiconductor wafers. The Semiconductor Equipment and Materials International Standards Program (SEMI) [documents SEMI E1-E57] describing specifications for 300-mm wafer equipment is hereby incorporated herein by reference.

Figure 1:
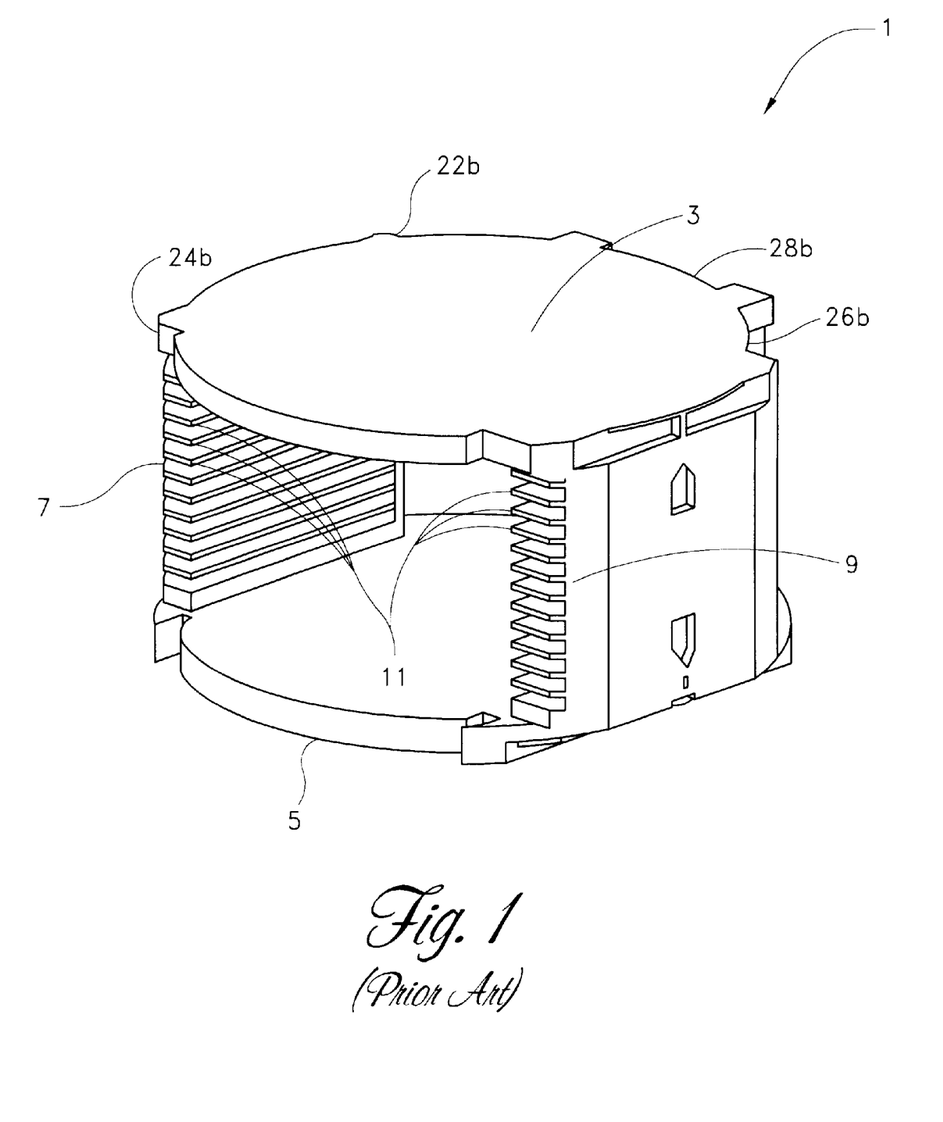
FIG. 1 (Prior Art) is a perspective front view of an existing wafer cassette used in the processing of wafers.

FIG. 1 (Prior Art) is a perspective front view of an existing wafer cassette 1 used during the processing of wafers. The cassette 1 is a device used in the storage and transportation of multiple wafers. The cassette 1 protects and stores the wafers and facilitates in the processing of the wafers. The cassette 1 includes a cassette top 3, a cassette base 5, a cassette support 7, and a cassette support 9. The cassette supports 7 and 9 each have a plurality of ribs 11. The plurality of ribs 11 transversely project outward from the supports 7 and 9 in a vertical alignment. The ribs 11 form channels which allow for the horizontally stacking of the wafers in the cassette 1. During the processing of wafers, such as the standard 300-mm (as described in SEMI E1.9-0997) wafers used in integrated circuit manufacturing, wafers (not shown) are horizontally stacked within the cassette 1. The cassette 1 has unique features such as indentations 24*b*, 22*b*, 28*b* and 26*b* which can be used to place and align the cassette.

The cassette 1 has several embodiments, depending on the manufacturer of the cassette 1. In the disclosed embodiment, the standard, EI.9-0997, specifies the characteristics and dimensions which the cassette 1 may conform with in the manufacture of semiconductor wafers. However, the cassette 1 may be any cassette capable of holding a plurality of wafers.

Figure 2:
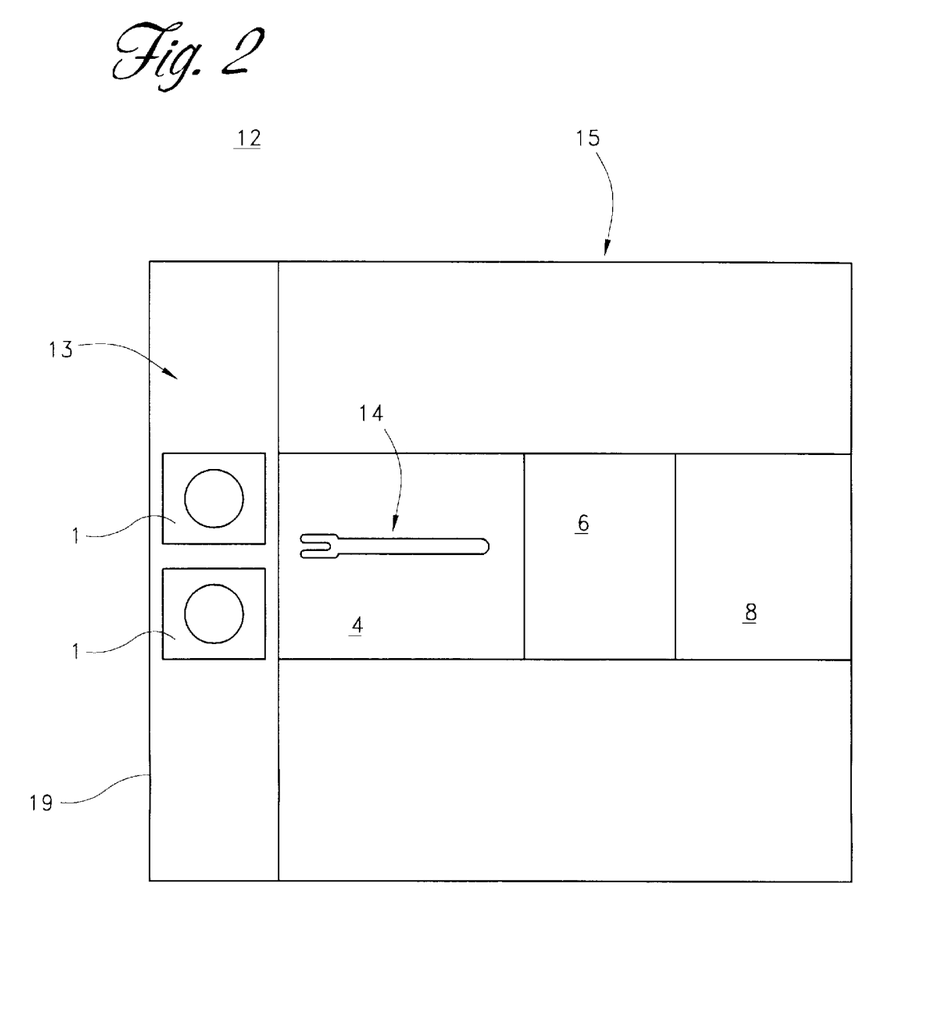
FIG. 2 is a top view of a wafer processing area used in the manufacture of wafers.

FIG. 2 is a top view of a wafer processing area 12 used in the manufacture of wafers. The wafer processing area 12 includes a staging area 13 and a processing area 15. A plurality of cassettes 1 are located within the staging area 13. Within each of the cassettes 1 is a plurality of wafers (not shown in FIG. 2). The wafers remain in the cassettes 1 awaiting the processing steps. Normally, a cassette of wafers is usually brought to a machine by either an operator or in some case a robotic transfer mechanism, and that cassette is used for the processing of those wafers only. Furthermore, a cassette is typically considered the home of the wafers, and each wafer's exact location in that cassette is tracked as the various processes at different sites are performed. In this way, defects, faults, and other quality issues can be isolated and identified throughout a semiconductor fabrication.

Once the cassette is positioned in the staging area 13, the wafers are individually removed from the cassettes by a robot arm 14, movable within all three dimensions, within a wafer transfer module 4 and placed within a wafer transfer unit 6 including, as is known in the art, a load lock interfaced to a processing unit 8 in the processing area 15 for processing the wafer. Normally, the wafer transfer module 4 is separated from the transfer unit 6 by a gate valve (not shown). Various steps are needed to process the wafers (e.g., etching, plasma vapor deposition, sputtering, cleaning, etc.), requiring different processing chambers within the processing area 15. Separating the staging area 13 and the wafer transfer module 4 is the load lock (not shown) which isolates the two areas. On the outer boundary of the staging area 13 is an air curtain 19, used in sustaining a ultra-clean environment during the processing of the wafers.

During the various steps of the processing of the wafers, the manufacturer sometimes wishes to inspect the wafers to insure that the wafers are within desired specifications after they have been processed and returned to the cassette 1. However, due to the increased chance of contamination of the wafers and the increased chance of misalignment of the cassette 1 during farther processing, either the entire processing system for the cassette 1 must be stopped in order to remove the cassette 1 from the staging area to inspect the wafers within the cassette 1, or only one wafer is placed within the cassette 1. In either case, time and money are wasted in testing the wafers.

Figure 3:
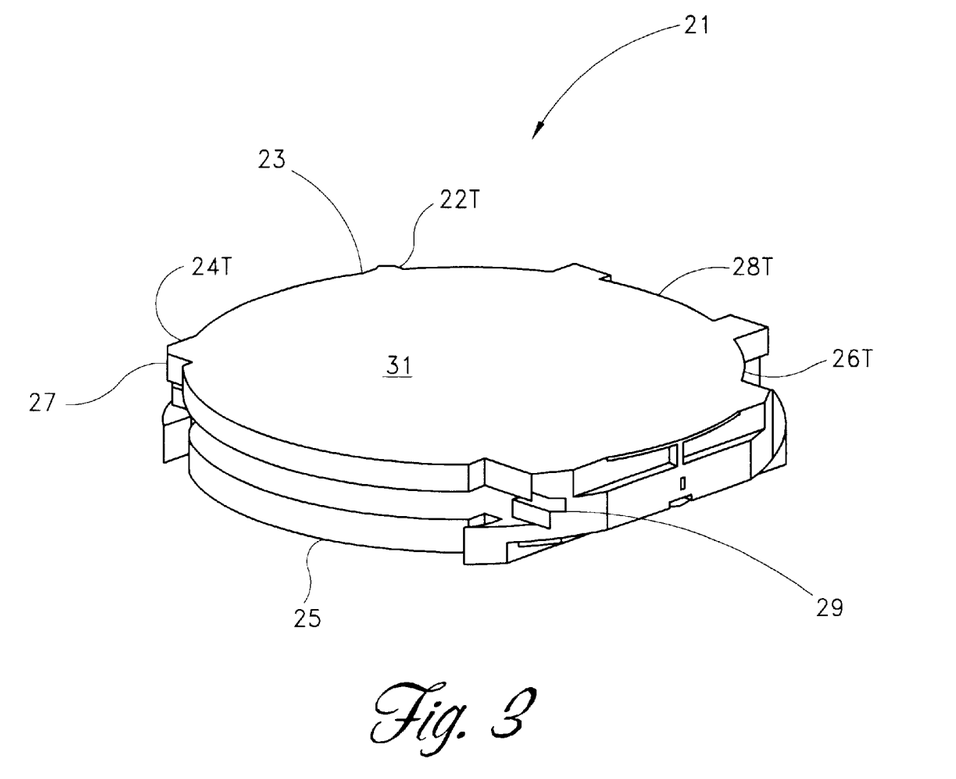
FIG. 3 is a front perspective view of a stackable cassette according to the teachings of the present invention.

FIG. 3 is a front perspective view of a stackable cassette 21 according to the teachings of the present invention. The stackable cassette 21 is similar in form to the cassette 1, but in the preferred embodiment, can only accommodate one, two or three wafers. The stackable cassette includes a stackable cassette top 23, a stackable cassette base 25, stackable cassette supports 27 and 29, and a plurality of ribs 31 in vertical alignment. The stackable cassette 21 depicted in FIG. 3 shows ribs 31 to accommodate one wafer. The stackable cassette base 25 is a surface which allows the bottom of the stackable cassette base 25 to stack on top of the cassette top 3 (FIG. 1). In one embodiment, the stackable cassette base 25 is a flat surface. In another embodiment, the stackable cassette base 25 is molded into a shape to conform with the cassette top 3.

Figure 4:
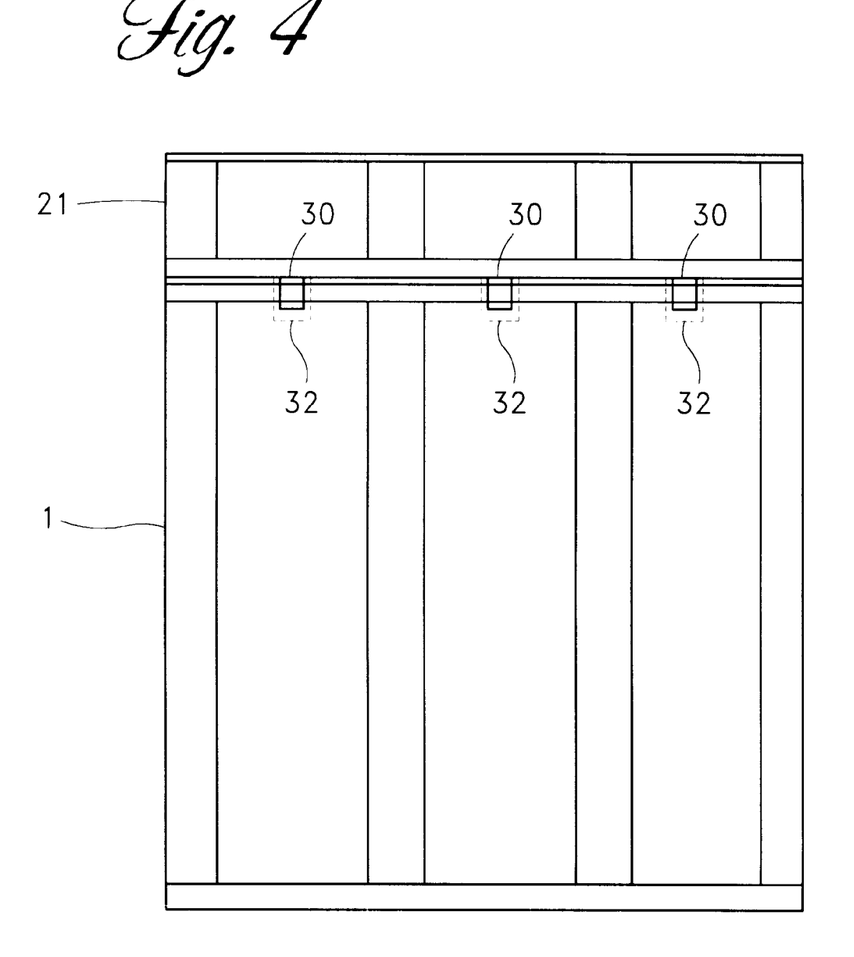
FIG. 4 is a rear view of a stackable cassette stacked upon another cassette.

FIG. 4 is a rear view of a stackable cassette 21 stacked upon the cassette 1. The stackable cassette 21 is placed upon the cassette top 3 and orientated in the same direction as the cassette 1. The stackable cassette base 25 conforms and orientates to the cassette top 3 in a proper alignment by locating upon certain dimensions, such as those specified within the standard, EI.9-0997 or utilizing the features such as indentations 24*t*, 22*t*, 28*t*, and 26*t*. It is obvious that these features may be correspondly aligned with indentations 24*b*, 22*b*, 28*b*, and 26*b* of cassette 1 to accurately placed the stackable cassette 21 on top of cassette 1. Although the stackable cassette base 25 may be shaped to fit any cassette 1, in the disclosed embodiment of the present invention, the stackable cassette base 25 is shaped to fit within the dimensional characteristics of any cassette 1 produced by any manufacturer conforming to the standard, EI.9-0997.

Alternatively, as depicted in FIG. 4, the stackable cassette 21 has a plurality of extensions 30 extending from stackable base 25. The extensions 30 fit within recesses 32 found on the cassette top 3 allowing the proper alignment of the stackable cassette 21 upon the cassette 1.

Referring to FIGS. 1, 2, 3, and 4, the operation of the stackable cassette 21 will now be explained. The stackable cassette 21 is stacked upon the cassette top 3. The stackable cassette 21 is orientated in the same direction as the cassette 1. The stackable cassette 21 and cassette 1 are facing in the same direction to allow the robot arm 14 to enter the two cassettes from the same direction. Additionally, if necessary, the stackable cassette 21 will rotate while the cassette 1 rotates. Therefore, only calibration of the robot arm 14 along the z-axis is necessary during the initial set-up of the wafer processing system. Wafers (not shown) are placed within cassette 1, usually before the cassette 1 is positioned within staging area 13. Although any wafer within cassette 1 may become a test wafer, normally the first wafer processed becomes the test wafer. Alternately, one or more test wafers may be placed within the stackable cassette 21. The processing of the wafers then begins with the robot arm 14 picking up a single wafer, from either the cassette 1 or the stackable cassette 21, and delivering it to the processing area 15 for processing of the wafer. The robot arm 14 will continue to deliver the wafers one at a time to the transfer unit 6 then to the processing unit 8. The transfer process is reversed following the completion of the process step by the processing unit 8 and each processed wafer is returned to the cassette 1 or 21.

Figure 5:
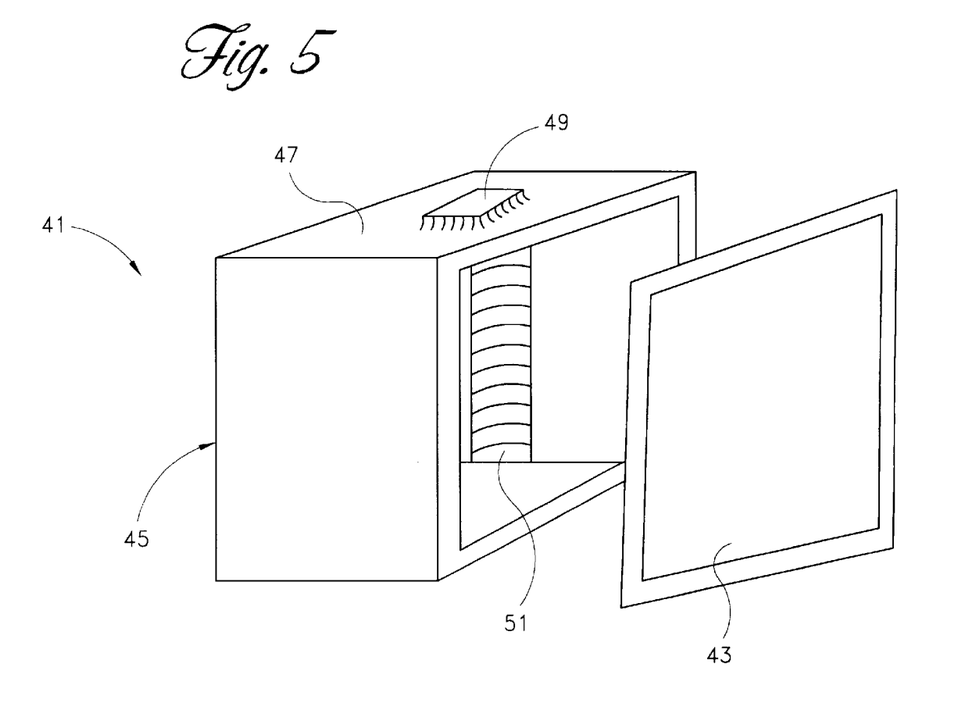
FIG. 5 is a front perspective view of a Front-Opening Unified Pod (FOUP) used in the processing of wafers.

During different points within the processing of the wafers, the manufacturer may desire to inspect and test a wafer. At the start-up of the manufacturing of wafers within a particular semiconductor machine, test wafers are used to test various recipes and processing techniques for the semiconductor machine. Additionally, monitor wafers are utilized to monitor the processing of various batches of wafers during the normal operational production. In either case, the term test wafer is used to denote the test wafer or monitor wafer utilized in the wafer processing. Rather then stop the process of the entire cassette, the test wafer (after processing) may be placed by the robot arm into the stackable cassette 21. The stackable cassette 21 may then be removed from the top of the cassette 1 and sent to a testing area for examination of the test wafer. Typically, the test wafer will be processed first, prior to the processing of the other wafers within the cassette 1, and then inspected. During the inspection of the test wafer, other wafers located within cassette 1 may continue to be processed. When testing is completed upon the test wafer, if necessary, the stackable cassette 21 may be returned to the stacked position on top of the cassette 1 during processing in order to receive further test wafers. This prevents the disruption of the processing of the other wafers within the cassette In an alternate embodiment of the present invention, the stackable cassette 1. may be used on the top of a Front-Opening Unified Pod (FOUP) (described in SEMI E47.1-0997) during the wafer processing. FIG. 5 is a front perspective view of a FOUP 41. The FOUP is a recently developed cassette utilized to environmentally isolate wafers from contamination from unclean sources. The FOUP 41 includes a FOUP door 43, a main FOUP body 45, a FOUP top 47 having a coupling device 49, and FOUP ribs 51.

Wafers are placed within an interior of the main FOUP body 45. The wafers are held in place in a similar manner described in FIG. 1 for the cassette 1. Specifically, the FOUP ribs 51 transversely project outward in a vertical alignment. The ribs 51 form channels which allow for the horizontally stacking of the wafers in the FOUP 41. The wafers are isolated from the environment by the FOUP door 43, which is opened when processing the wafers within the staging area 13 (FIG. 2). Located upon the FOUP top 47 is the coupling device 49 used in the transportation and processing of the FOUP 41.

In a similar fashion as described above, the stackable cassette (not shown in FIG. 5) is placed upon the FOUP 41 during the beginning of the wafer processing. The stackable cassette is aligned and properly orientated upon the FOUP 41 by locating upon the coupling device 49. The coupling device 49 is defined in the document, SEMI E47.1-0997, and therefore, provides a generic dimension upon which the cassette 21 may align upon. The bottom surface of the stackable cassette is shaped to conform to the coupling device 49, thereby providing proper orientation of the stackable cassette upon the FOUP 41. In the disclosed embodiment of the present invention, the stackable cassette does not have a cassette door. However, in alternate embodiments, the stackable cassette may have a cassette door, thereby isolating the test wafer from the environment in a similar manner as the wafers are isolated within the FOUP 41. Upon the completion of the processing of the test wafer, the processed test wafer is moved into the stackable cassette 21. The stackable cassette 21 is then removed from above the FOUP 41. During the inspection of the test wafer, wafer processing can continue for the wafers still remaining within the FOUP 41.

Figure 6:
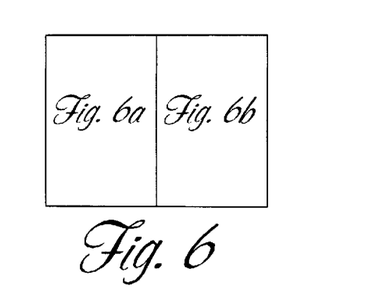
FIGS. 6A–6B are flow charts illustrating the steps of testing a wafer according to the teachings of the present invention.
Figure 6A:
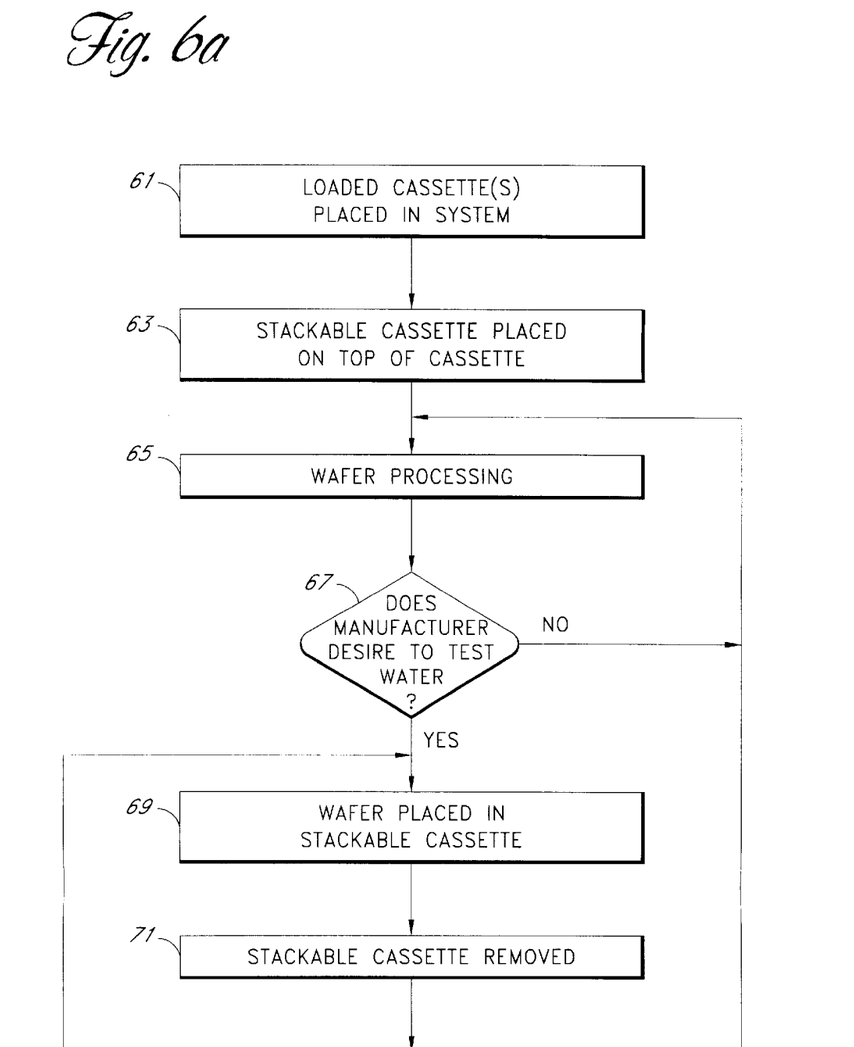
Figure 6B:
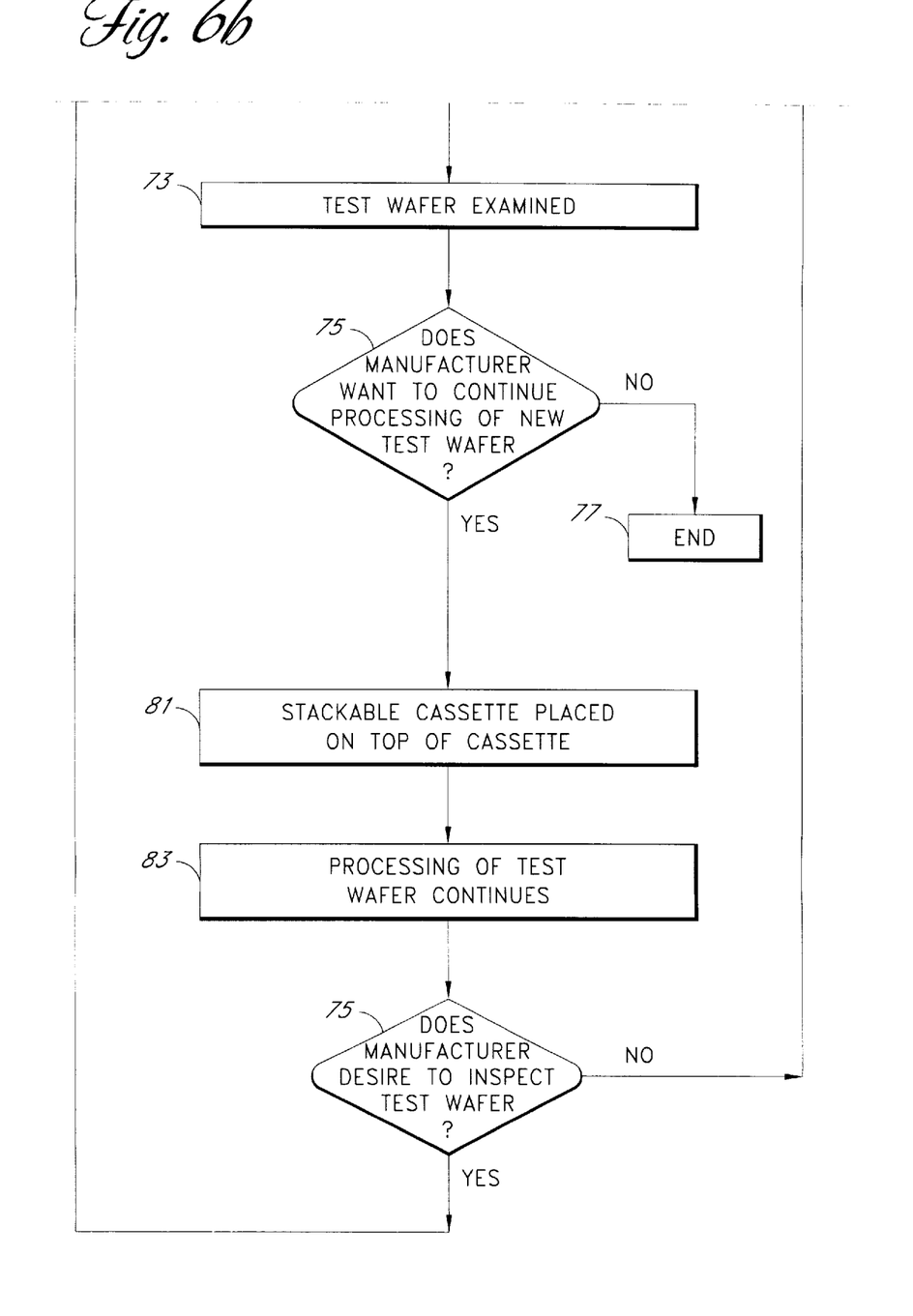

FIGS. 6A–6B are flow charts illustrating the steps of testing a wafer according to the teachings of the present invention. Referring to FIGS. 1, 2, 3, 4, 5, 6A, and 6B, the method will be explained. The method begins with step 61 where wafers are placed within in the cassette 1 and cassette placed in front of the system which can be done by a cassette robot (not shown). In other embodiments of the present invention, one or more wafers may be placed within the stackable cassette 21. Next, in step 63, the stackable cassette 21 is stacked on top of the cassette 1. The stackable cassette 21 is properly located upon the cassette 1 by aligning of the outer dimensions and features of the cassette 1 common to all cassettes utilizing the standards specified in document SEMI E1.9-0997. In step 65, the wafers located within the cassette 1 are transferred by a robot arm which selects a wafer and delivers the wafer to a chamber for processing. In most circumstances, the first wafer to be processed will be the test wafer. Next, in step 67, it is determined if the manufacturer desires to inspect the test wafer. If the manufacturer does not desire to inspect the test wafer, the method returns to step 65, where the processing of the wafers continues.

However, in step 67, if it is determined that the manufacturer desires to inspect the test wafer, the method moves from step 67 to step 69 where the test wafer is placed in the stackable cassette 21. Next, in step 71, the stackable cassette 21 is removed from the top of the cassette 1. In step 73 (FIG. 6B), the test wafer is removed from the stackable cassette 21 and examined, while processing continues on the wafers from cassette 1. In step 75, it is determined if the manufacturer wants to continue in the processing of a new test wafer. A new test wafer may be used to determine the effect of each change to the recipe in the processing of the wafers within the cassette 1. If the manufacturer does not want to continue in the processing of the new test wafer, the method moves to step 77 where the method ends.

However, if the manufacturer wants to continue in the processing of the new test wafer, the method moves from step 75 to step 81 where the the stackable cassette 21 is stacked on top of the cassette 1. In step 83, the processing of the test wafer (and wafers within the cassette 1) continues. In step 85, it is determined if the manufacturer desires to examine a second test wafer. If the manufacturer does not wish to inspect the test wafer, the method moves to step 65 via connection C where the processing of the wafers continues. But if the manufacturer wishes to inspect the second test wafer, the method moves from step 85 to step 69 (FIG. 6A) via connection B where the test wafer is placed in the stackable cassette 21. The process then continues as described above.

In an alternate use, the stackable cassette 21 can be used for separating different wafers for the same batch of wafers within cassette 1. For example, if a batch contains one or more wafers that are different from the rest of the wafers within the cassette 1, they can be separated and routed differently during the manufacturing process.

In another alternate embodiment of the present invention, the stackable cassette 21 may be placed on top of the FOUP 41. In this alternate embodiment, the FOUP 41 replaces the cassette 1 in the method described in FIGS. 6A and 6B.

Figure 7:
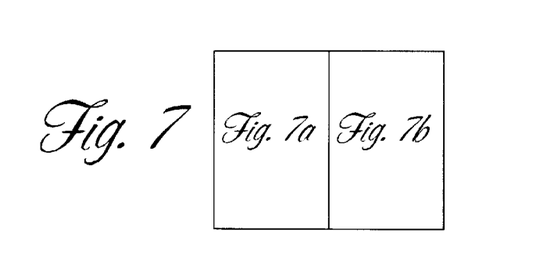
FIGS. 7A and 7B are flow charts illustrating the steps for monitoring wafer quality during long run processing according to the teachings of the present invention.
Figure 7A:
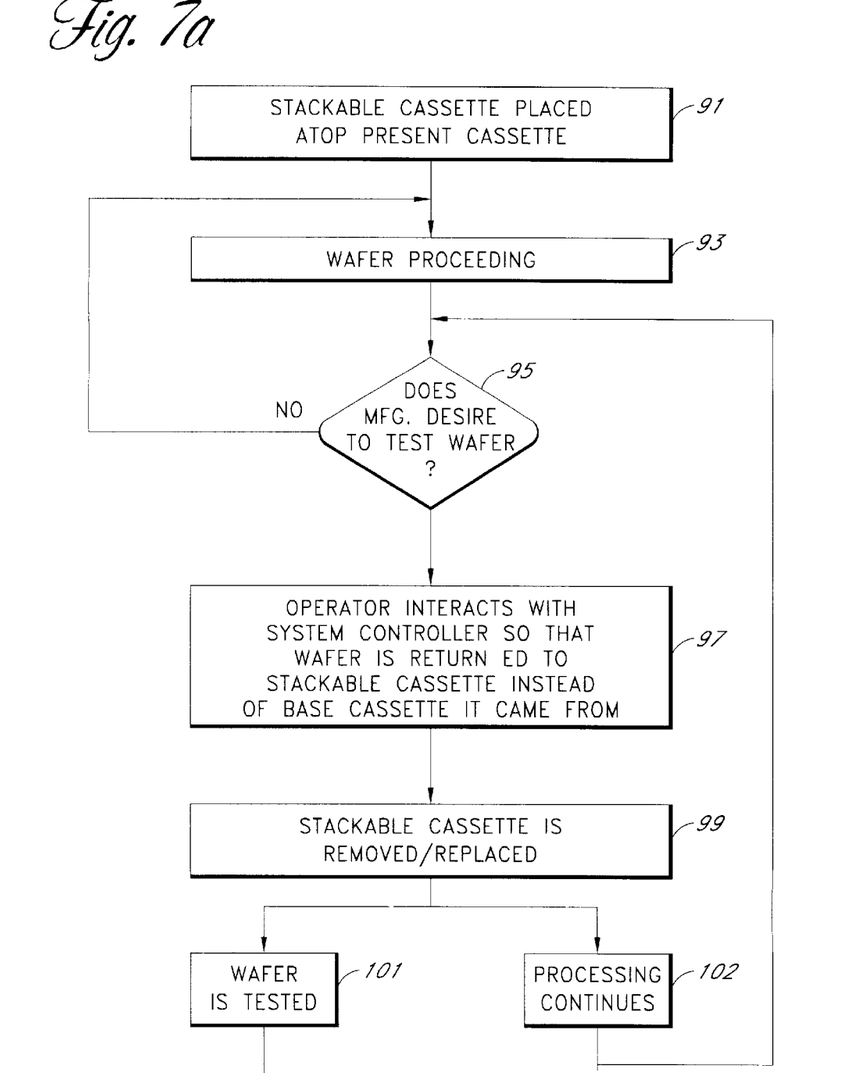
Figure 7B:
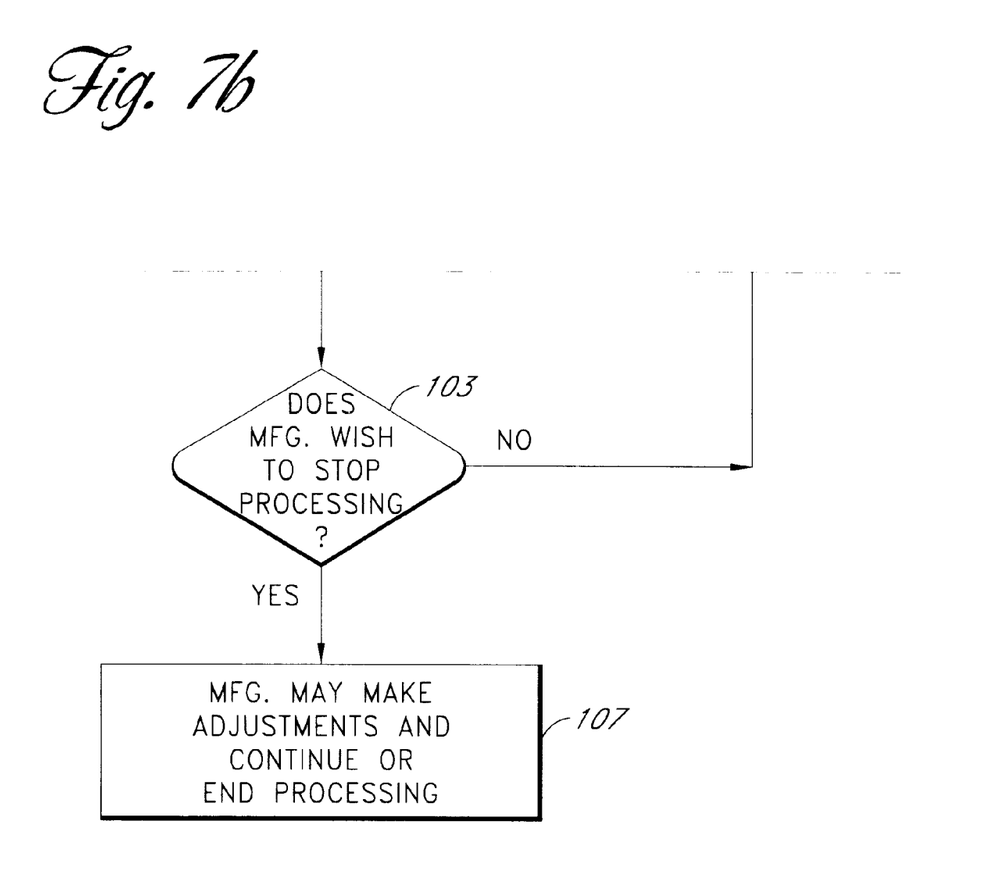

FIGS. 7A and 7B are flow charts illustrating the steps for monitoring wafer quality during long run processing according to the teachings of the present invention. Referring to FIGS. 1, 2, 3, 4, 5, 7A, and 7B, the method begins with step 91 where the stackable cassette 21 is positioned on top of the base cassette 1. A plurality of wafers are typically located within the cassette 1, prior to cassette 1 entering the staging area 13. In other embodiments of the present invention, at least one wafer is placed within the stackable cassette prior to positioning the stackable cassette 21 on top of the cassette 1. Next, in step 93, processing of the wafers begins. During the processing of the wafers, in step 95, it is determined if the manufacturer desires to test a wafer. If the manufacturer does not desire to inspect a test wafer, the method returns to step 93, where the processing of the wafers continues.

However, in step 95, if it is determined that the manufacturer desires to inspect the test wafer, the method moves from step 95 to step 97 where the test wafer is returned to the stackable cassette 21. An operator of the wafer processing system interacts with a system controller controlling the processing of the wafers. The interaction of the operator results in the test wafer being placed within the stackable cassette 21, rather than returning the test wafer to the cassette 1. Next, in step 99, the stackable cassette 21 is removed from the top of the cassette 1. In step 101, the test wafer is inspected by the manufacturer. While the processing continues at step 102.

Next, in step 103, it is determined if the manufacturer wishes to stop the processing of the wafers. If the manufacturer does not wish to stop the wafer processing, the method moves again to step 102.

However, if it is determined that the manufacturer wishes to stop wafer processing, the method moves from step 103 to step 107. In step 107, the manufacturer may stop processing and make adjustments to correct any deficiencies noted when inspecting the test wafer.

The stackable cassette 21 provides many advantages to the manufacturer of semiconductor wafers. First, faster feedback is provided to the manufacturer on the quality of the process. A test wafer can be removed for testing immediately after it is processed, without waiting for the rest of the wafers in the entire cassette to be processed. Therefore, any adjustments or changes necessary in the processing of the wafers can be made quickly, and before the rest of the wafers are processed.

Another advantage is the ease in facilitating a change to the process of manufacturing wafers to accommodate the stackable cassette. In order to process the test wafers within the stackable cassette 21, a robot arm need only be programmed for a minimum increase in the Z-stroke (along the z-axis of the cassette 1). Any rotational and radial action of the robot arm 14 would not be necessary. This reduces the time and cost of re-calibrating the wafer processing system to accommodate the stackable cassette 21. In addition, the change in the movement of the robot arm in processing the wafers is small, thereby providing an uninterrupted flow in the wafer manufacturing process.

What is claimed is:

1. A method of manufacturing a semiconductor wafers comprising the steps of:
    extracting a wafer from a plurality of wafers stored in a first cassette;
    processing the wafer in a processing system according to an initial set of processing parameters; and,
    placing the processed wafer within a second cassette stacked on the first cassettes and measuring the processed wafer after removing the second cassette from the first cassette.

2. The method according to claim 1, further comprising the step of processing the plurality of wafers within the first cassette after the step of measuring the processed wafer.

3. The method according to claim 1 further comprising the steps of:
    modifying at least one process parameter of the initial set of process parameters after the step of measuring the processed wafer; and
    processing the remaining member of the plurality of wafers according to the modified set of processing parameters.

4. A method of manufacturing semiconductor wafers comprising the steps of:
    extracting a first wafer from a first cassette that is stacked on a second cassette, the second cassette having a plurality of wafers stored therein;
    processing the first wafer in a processing system according to an initial set of processing parameters;
    placing the processed first wafer within the first cassette; and
    measuring the first processed wafer after removing the first cassette from the second cassette.

5. The method according to claim 4, further comprising, after the step of processing the first wafer, processing sequentially the plurality of wafers located in the second cassette after the step of measuring the first processed wafer.

6. The method according to claim 5 further comprising, after the step of processing the first wafer;
    processing a second wafer from the plurality of wafers; and
    placing the second wafer within the first cassette.

7. The method according to claim 4 further comprising the steps of:
    modifying at least one process parameter of the initial set of process parameters after the step of measuring the first processed wafer; and
    processing the plurality of wafers according to the modified set of parameters.

8. A system for manufacturing semiconductor wafers comprising:
    means for extracting a wafer from a first cassette having a plurality of wafers stored therein;
    means for processing the wafer according to an initial set of processing parameters;
    means for placing the processed wafer within a second cassette stacked on the first cassette;
    means for removing the second cassette from the first cassette;
    means for measuring the processed wafer; and
    means for modifying at least one parameter of the initial set of processing parameters.

9. The system according to claim 8 wherein the second cassette comprises:
    a base providing a bottom portion of the second cassette, the base is in a shape conforming to a top portion of the first cassette having a plurality of wafers;
    a plurality of supports extending perpendicularly and vertically upward from the base;
    a top surface horizontally covering the plurality of supports; and
    means for holding at least one test wafer between the plurality of supports;
    whereby the second cassette is stacked upon the top portion of the first cassette during processing of the plurality of wafers.

10. The system according to claim 9 wherein the base of the second cassette forms a surface adaptive for placement of the cassette on the top portion of the first cassette.

11. The system according to claim 10 wherein the means for holding at least one test wafer in the second cassette comprises, a plurality of projecting transverse ribs extending from the plurality of supports forming a plurality of channels for the accommodation of at least one test wafer in the cassette.

12. The system according to claim 4, wherein the first cassette is a Front Opening Unified Pod comprising a hinged member covering a front area between the base and top surface wherein the hinged member is openable by the means for extracting a wafer and closeable by the means placing the processed wafer.

13. A system for manufacturing semiconductor wafers comprising:
    means for extracting a first wafer from a first cassette that is stacked on a second cassette having a plurality of wafers stored therein;
    means for processing the first wafer according to an initial set of processing parameters;
    means for placing the processed first wafer within the first cassette;
    means for removing the first cassette from the second cassette;

means for measuring the first processed wafer; and means for modifying at least the processed parameters of the initial set of processing parameters.

14. The system according to claim 13 wherein the first cassette comprises:
- a base providing a bottom portion of the first cassette, the base is in a shape conforming to a top portion of the second cassette having a plurality of wafers;
- a plurality of supports extending perpendicularly and vertically upward from the base;
- a top surface horizontally covering the plurality of supports; and
- means for holding at least one test wafer between the plurality of supports;
- whereby the first cassette is stacked upon the top portion of the second cassette during processing of the plurality of wafers.

15. The system according to claim 14 wherein the base of the first cassette forms a surface adaptive for placement of the first cassette on the top portion of the second cassette.

16. The system according to claim 15 wherein the means for holding at least one test wafer in the first cassette comprises, a plurality of projecting transverse ribs extending from the plurality of supports forming a plurality of channels for the accommodation of at least one test wafer in the cassette.

17. The system according to claim 14, wherein the second cassette is a Front Opening Unified Pod comprising a hinged member covering a front area between the base and top surface wherein the hinged member is openable by the means for extracting a wafer and closeable by the means placing the processed wafer.

* * * * *